(12) United States Patent
Choi et al.

(10) Patent No.: US 9,954,089 B2
(45) Date of Patent: Apr. 24, 2018

(54) LOW DISLOCATION DENSITY III-NITRIDE SEMICONDUCTOR COMPONENT

(71) Applicant: Infineon Technologies Americas Corp., El Segundo, CA (US)

(72) Inventors: Chan Kyung Choi, Woodbury, MN (US); Mihir Tungare, Roseville, MN (US); Peter Wook Kim, Stillwater, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/186,860

(22) Filed: Jun. 20, 2016

(65) Prior Publication Data

US 2017/0365699 A1    Dec. 21, 2017

(51) Int. Cl.
| | |
|---|---|
| *H01L 29/10* | (2006.01) |
| *H01L 29/778* | (2006.01) |
| *H01L 29/20* | (2006.01) |
| *H01L 29/205* | (2006.01) |
| *H01L 29/06* | (2006.01) |

(52) U.S. Cl.
CPC .......... *H01L 29/7783* (2013.01); *H01L 29/06* (2013.01); *H01L 29/10* (2013.01); *H01L 29/2003* (2013.01); *H01L 29/205* (2013.01); *H01L 29/778* (2013.01); *H01L 29/7786* (2013.01)

(58) Field of Classification Search
CPC ...................... H01L 29/06; H01L 29/10; H01L 2924/10344; H01L 2924/1033; H01L 2924/10323; H01L 29/778; H01L 27/0605; H01L 29/7786; H01L 27/0248; H01L 29/42364; H01L 29/1066; H01L 29/2003; H01L 29/7783
See application file for complete search history.

(56) References Cited

U.S. PATENT DOCUMENTS

| | | | |
|---|---|---|---|
| 6,184,144 B1 | 2/2001 | Lo | |
| 6,870,191 B2 | 3/2005 | Niki | |
| 7,455,729 B2 | 11/2008 | Beaumont | |
| 8,405,064 B2 | 3/2013 | Yamaguchi et al. | |
| 2003/0057444 A1 | 3/2003 | Niki | |
| 2013/0181327 A1* | 7/2013 | Miyoshi | C23C 16/303 257/615 |

OTHER PUBLICATIONS

Daudin, B. et al., "Stranski-Krastanov growth mode during the molecular beam epitaxy of highly strained GaN", The American Physical Society, Physical Review B, vol. 56, No. 12, Sep. 15, 1997, pp. R7069-R7072.

* cited by examiner

*Primary Examiner* — A. Sefer
(74) *Attorney, Agent, or Firm* — Murphy, Bilak & Homiller, PLLC

(57) ABSTRACT

There are disclosed herein various implementations of a semiconductor component including a protrusion propagation body. The semiconductor component includes a substrate, a III-Nitride intermediate stack including the protrusion propagation body situated over the substrate, a III-Nitride buffer layer situated over the group III-V intermediate stack, and a III-Nitride device fabricated over the group III-V buffer layer. The protrusion propagation body includes at least a protrusion generating layer and two or more protrusion spreading multilayers.

13 Claims, 7 Drawing Sheets

LOW DISLOCATION DENSITY III-NITRIDE SEMICONDUCTOR COMPONENT

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzite, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium. A III-N or a GaN transistor may also refer to a composite high voltage enhancement mode transistor that is formed either by connecting the III-N or the GaN transistor in cascode with a lower voltage group IV transistor or using P type GaN as a gate.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

Group III-V semiconductors, such as gallium nitride (GaN) and other III-Nitride materials have become increasingly important for the fabrication of power switching devices, such as III-Nitride or other group III-V field-effect transistors (FETs), high electron mobility transistors (HEMTs), and Schottky diodes, for example. Due to the typically small wafer size and high cost of native group III-V substrates, non-native substrates including sapphire, silicon carbide (SiC), and silicon substrates are commonly used to grow the group III-V films providing the group III-V device active layers. Among these non-native substrates, silicon is advantageous because of its large wafer size, low cost, and ease of processing. However, the use of silicon substrates for the fabrication of group III-V devices presents considerable challenges. For example, lattice mismatch and differences in the thermal expansion coefficients between group III-V semiconductors and silicon can undesirably result in high density crystal dislocations and large wafer bow induced by group III-V film stress.

SUMMARY

The present disclosure is directed to a low dislocation density III-Nitride semiconductor component, substantially as shown in and/or described in connection with at least one of the figures, and as set forth in the claims.

DETAILED DESCRIPTION

Figure 1:
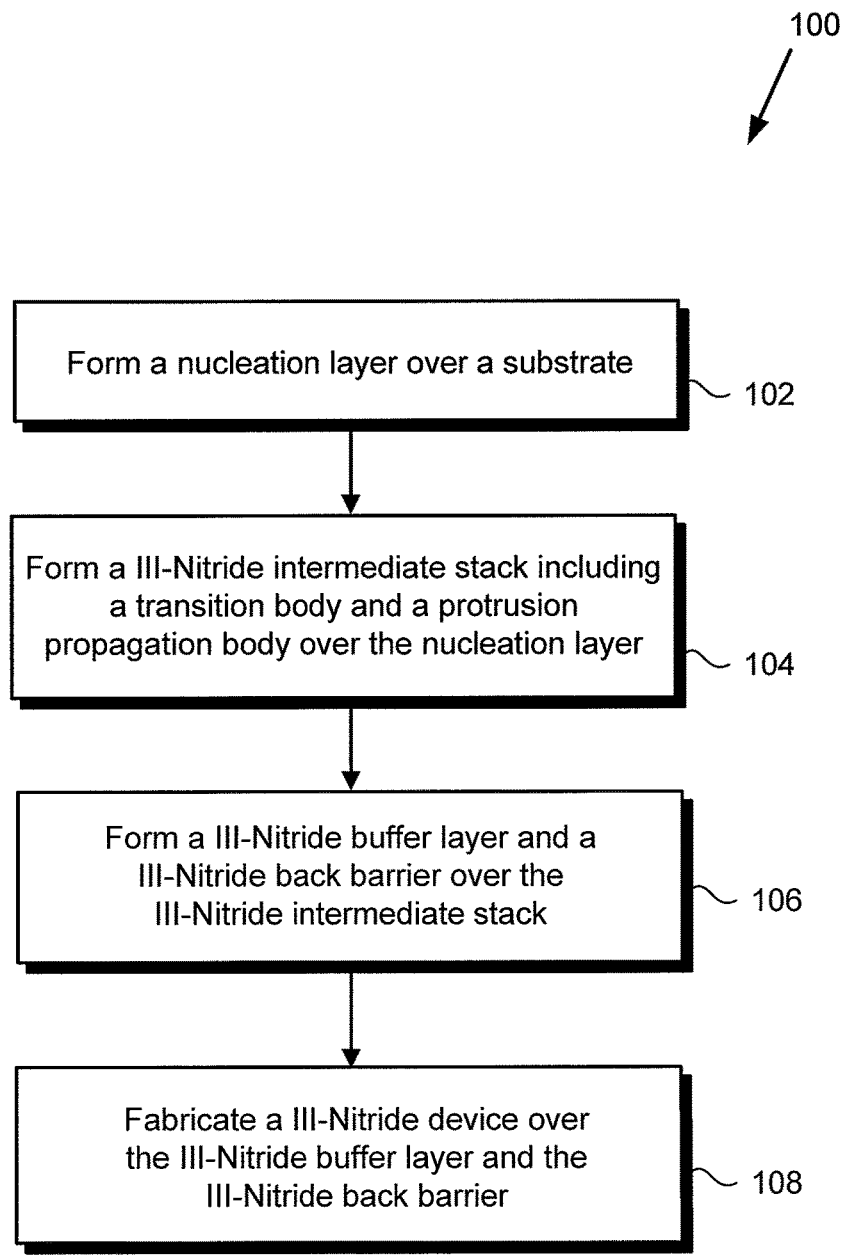
FIG. 1 shows a flowchart presenting an exemplary method for fabricating a semiconductor component including a protrusion propagation body, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, group III-V semiconductors, such as gallium nitride (GaN) and other III-Nitride materials are important and desirable for the fabrication of power switching devices. As further stated above, due to disadvantages associated with conventional native III-Nitride or other group III-V substrates, silicon substrates are often used as non-native substrates for group III-V devices. However, it has been noted that the use of silicon substrates for the fabrication of group III-V devices presents considerable challenges.

For example, lattice mismatch and differences in the thermal expansion coefficients between group III-V semiconductors and silicon can undesirably result in high density crystal dislocations and large wafer bow induced by group III-V film stress. As known in the art, threading dislocations act as lateral and vertical current leakage paths during off-state and on-state stress that can undesirably result in device breakdown. Moreover, charged dislocations reduce carrier mobility through scattering. As a result, reduction in the density of crystal dislocations can advantageously improve group III-V device reliability and stability, as well as enable faster switching.

The present application is directed to a semiconductor component having a group III-V intermediate stack including a protrusion propagation body, and a method for fabricating such a semiconductor component. The use of a protrusion propagation body as disclosed herein advantageously enables the growth of overlying group III-V layers or films having substantially improved crystal quality. That is to say, the overlying group III-V layers or films have reduced crystal dislocations compared to group III-V layers or films in conventional semiconductor components from which the presently disclosed protrusion propagation body is omitted. As a result, the inventive concepts disclosed in the present application enable fabrication of III-Nitride and other group III-V based transistors having improved high frequency performance and reduced leakage current under high drain bias voltages due to low crystal dislocation density in the device layers.

Referring to FIG. 1, FIG. 1 shows flowchart 100 presenting an exemplary method for fabricating a semiconductor component including a protrusion propagation body. It is noted that certain details and features have been left out of flowchart 100 that are apparent to a person of ordinary skill in the art, in order not to obscure the discussion of the inventive features in the present application.

Figure 2A:
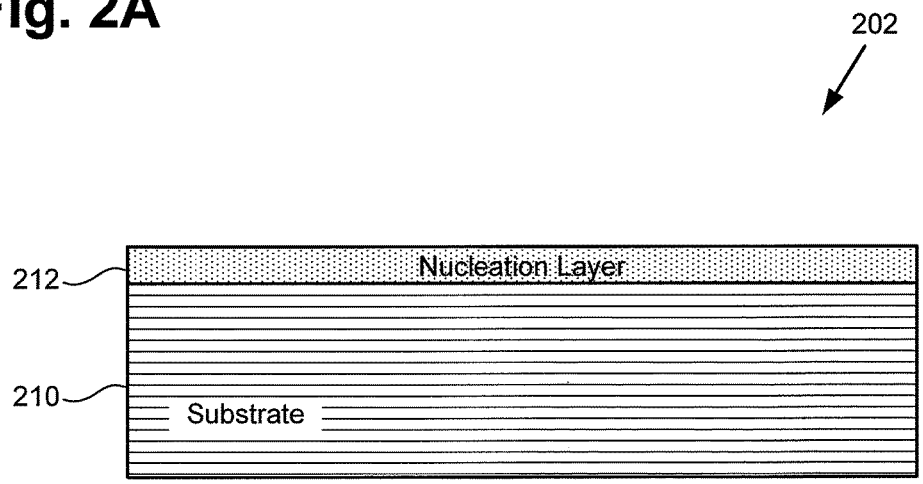
FIG. 2A shows a cross-sectional view of an exemplary structure corresponding to an initial fabrication stage according to one implementation of the flowchart of FIG. 1.

Referring now to FIG. 2A, FIG. 2A shows a cross-sectional view of structure 202. As shown in FIG. 2A, structure 202 includes substrate 210 and nucleation layer 212 situated over substrate 210. In particular, substrate 210 is selected so as to be suitable for use as a support substrate for a group III-V device, while nucleation layer 212 is implemented to facilitate growth of various group III-V material layers over substrate 210.

Figure 2B:
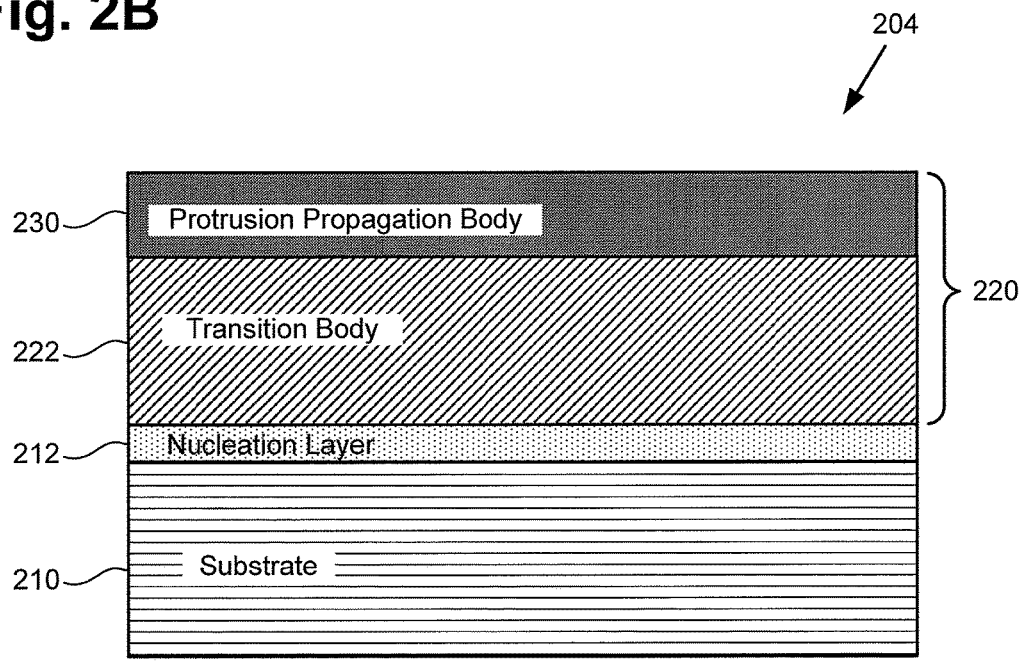
FIG. 2B shows a cross-sectional view of the exemplary structure of FIG. 2A at a subsequent fabrication stage according to one implementation of the flowchart of FIG. 1.
Figure 2C:
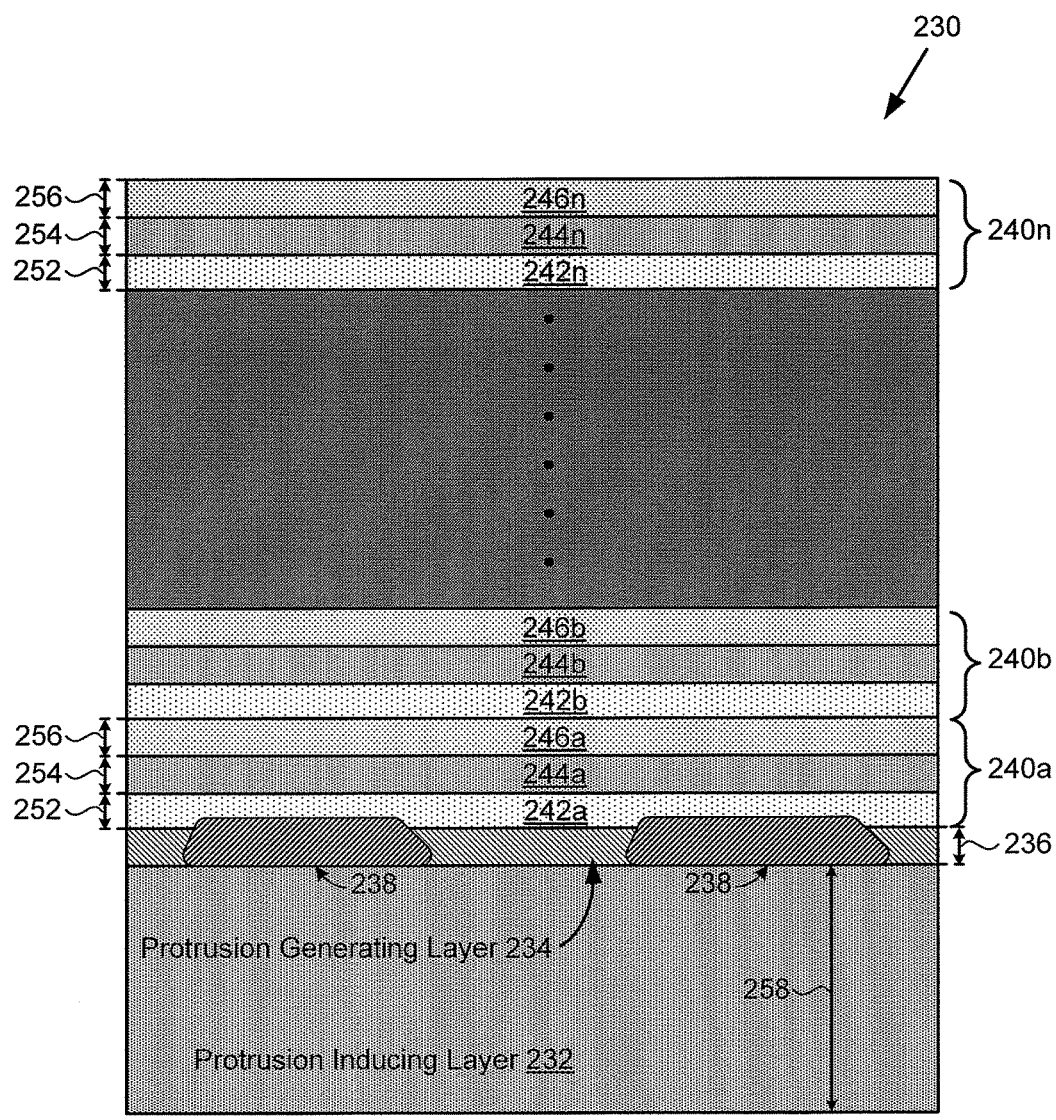
FIG. 2C shows a more detailed cross-sectional view of the protrusion propagation body of the structure of FIG. 2B, according to one exemplary implementation.
Figure 2D:
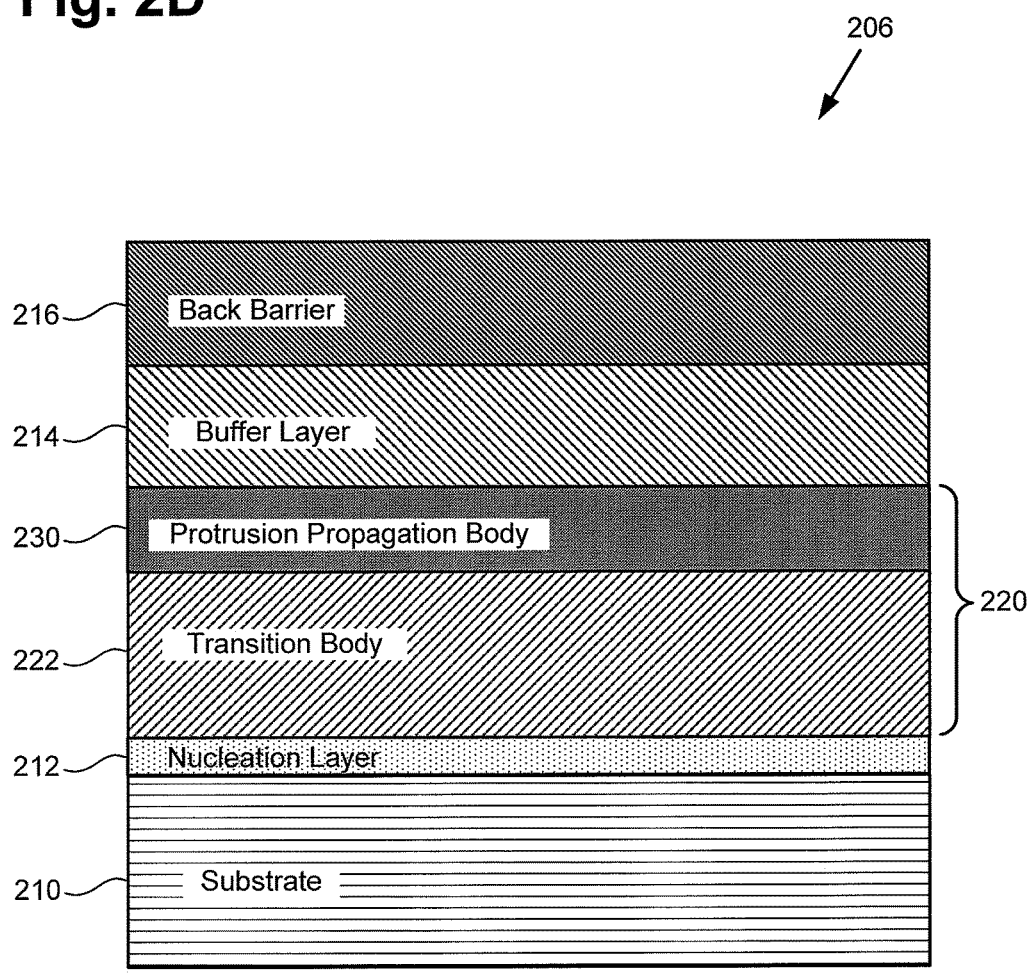
FIG. 2D shows a cross-sectional view of the exemplary structure of FIG. 2B at a subsequent fabrication stage according to one implementation of the flowchart of FIG. 1.
Figure 2E:
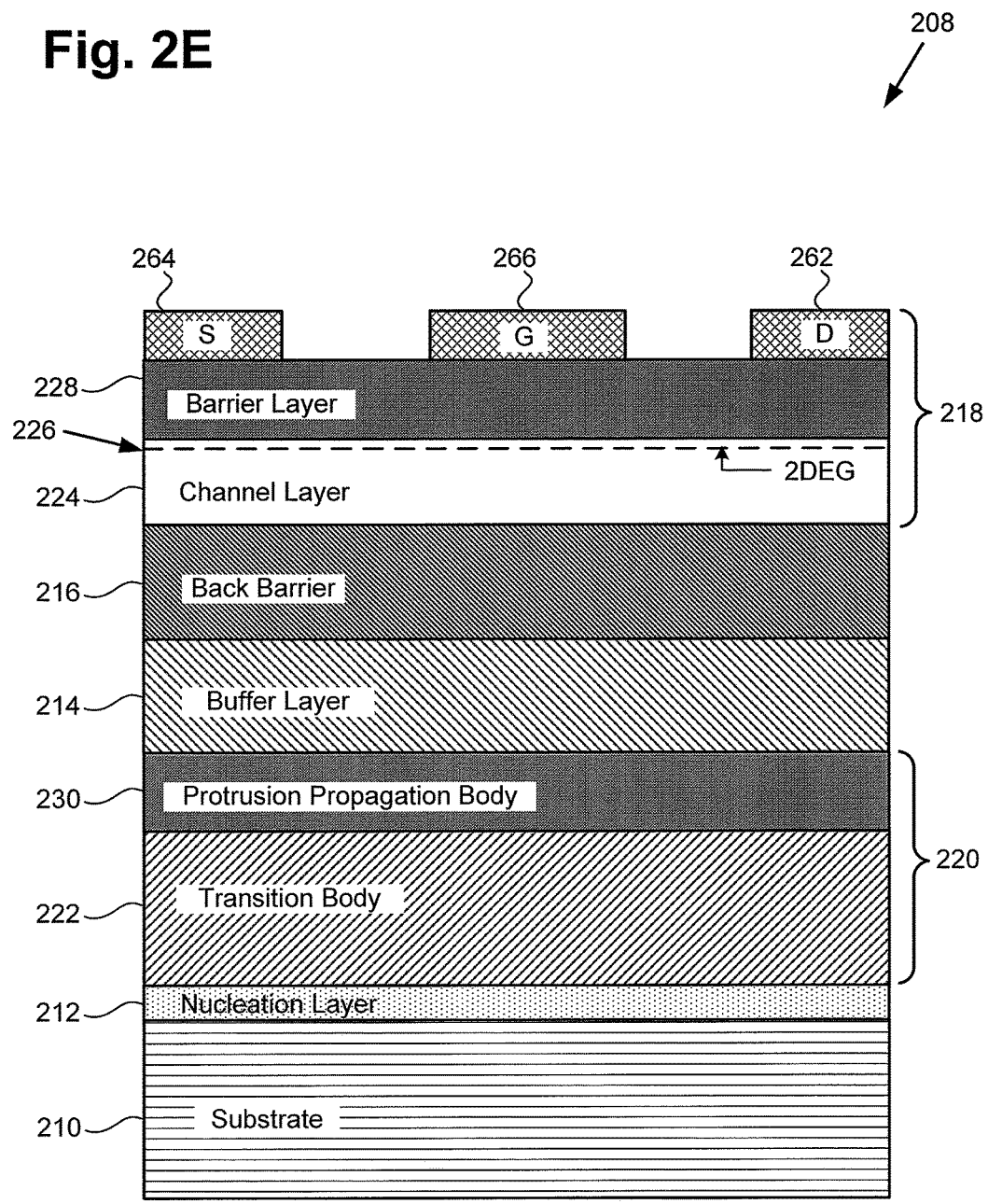
FIG. 2E shows a cross-sectional view of an exemplary semiconductor component including a protrusion propagation body, according to one implementation.

Proceeding on to FIGS. 2B and 2C, structure 204 in FIG. 2B shows the result of forming group III-V intermediate stack 220 over nucleation layer 212 (action 104), while FIG. 2C shows a more detailed view of protrusion propagation body 230 included in group III-V intermediate stack 220. Moreover, FIG. 2D, shows the result of forming group III-V buffer layer 214 and group III-V back barrier 216 over group III-V intermediate stack 220 (action 106), while FIG. 2E shows a cross-sectional view of semiconductor component 208 including protrusion propagation body 220, according to one exemplary implementation.

Figure 3A:
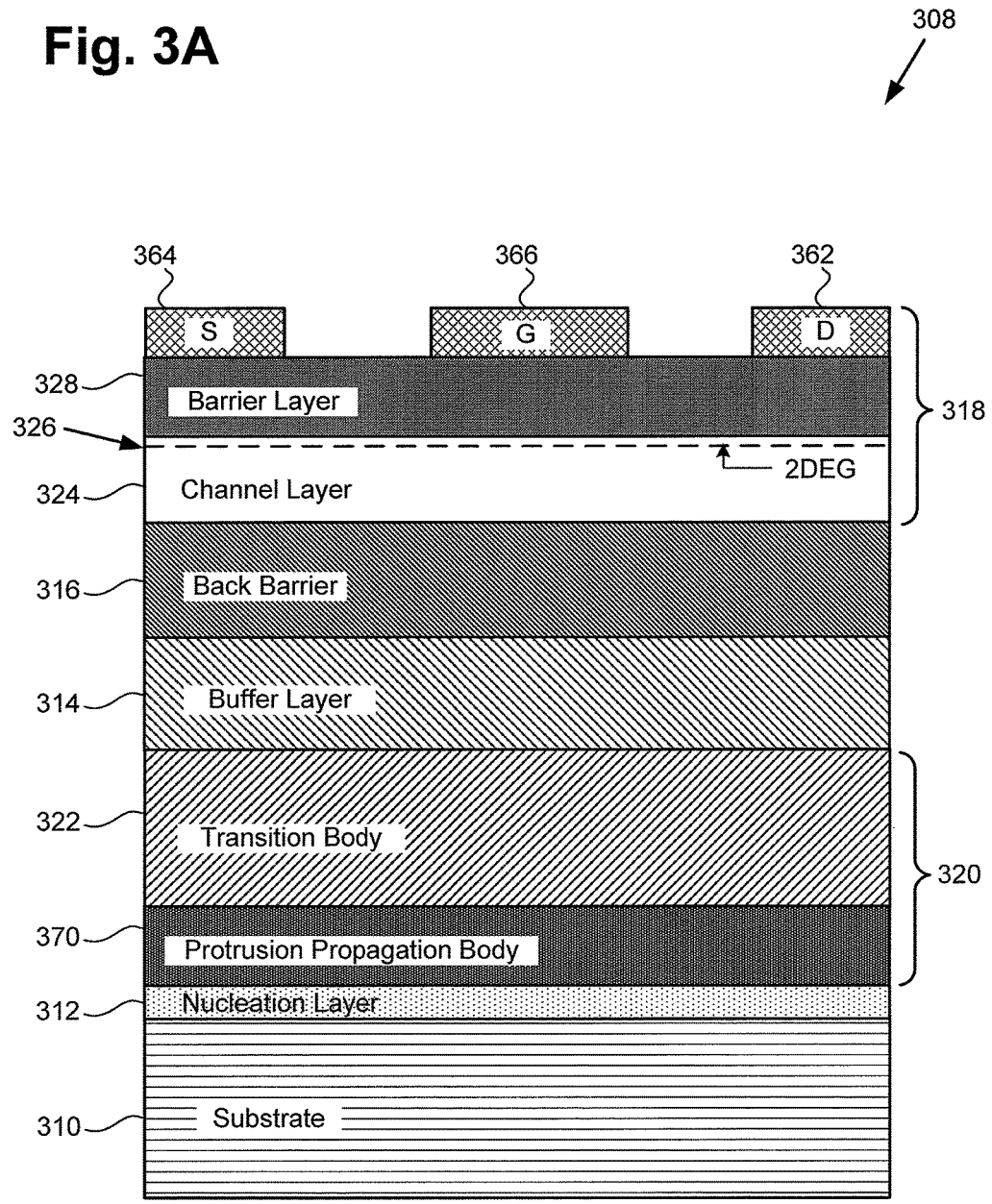
FIG. 3A shows a cross-sectional view of an exemplary semiconductor component including a protrusion propagation body, according to another implementation.
Figure 3B:
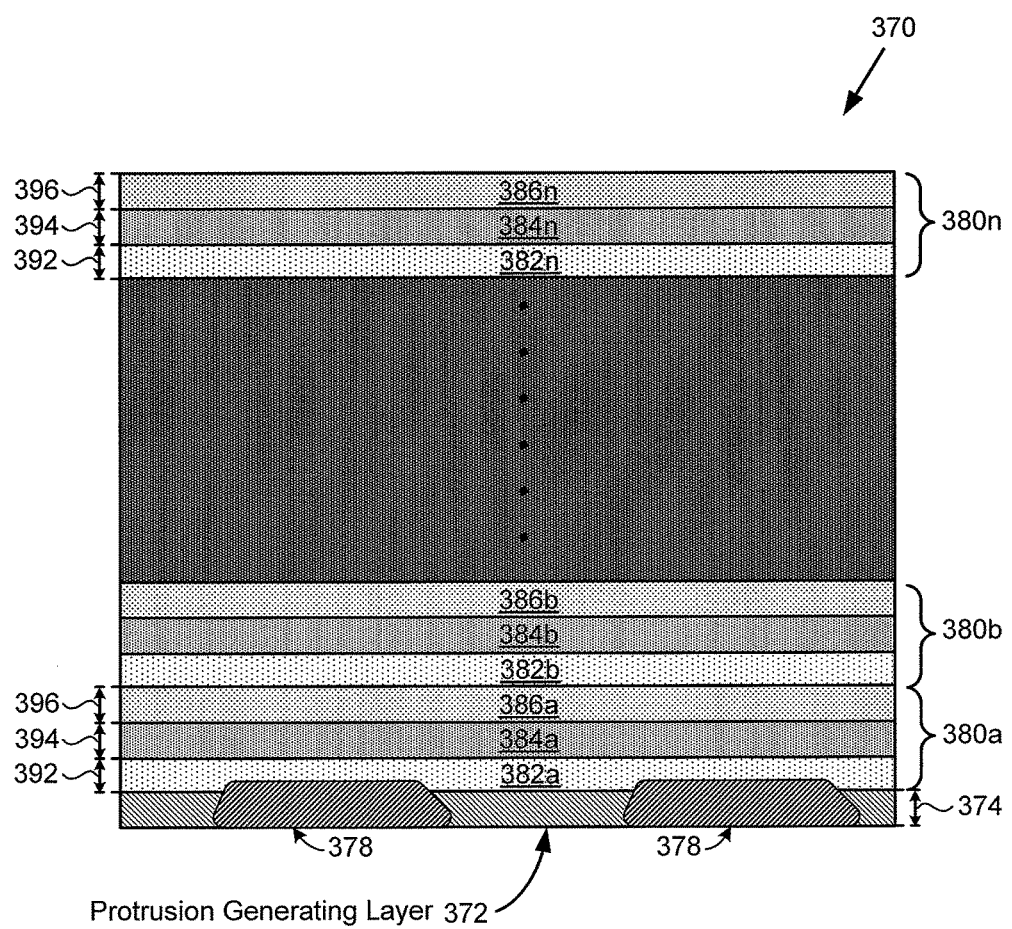
FIG. 3B shows a more detailed cross-sectional view of the protrusion propagation body of the semiconductor component of FIG. 3A, according to one exemplary implementation.

It is noted that the structures shown in FIGS. 2A, 2B, 2C, 2D, and 2E (hereinafter "FIGS. 2A-2E"), as well as the alternative structures shown by FIGS. 3A and 3B, are provided as specific implementations of the present inventive principles, and are shown with such specificity for the purposes of conceptual clarity. It should also be understood that particular details such as the materials used to form the structures shown in FIGS. 2A-2E, 3A, and 3B, as well as the techniques used to produce the various depicted features, are being provided merely as examples, and should not be interpreted as limitations. Moreover, although the exemplary structures shown in FIGS. 2A-2E, 3A, and 3B will be described as including various III-Nitride material layers, in other implementations, structures corresponding to the structures shown in FIGS. 2A-2E, 3A, and 3B may include other group III-V semiconductor based material layers.

Referring to structure 202, in FIG. 2A, in conjunction with FIG. 1, flowchart 100 begins with forming nucleation layer 212 over substrate 210 (action 102). As noted above, substrate 210 may include any material suitable for use as a substrate for fabrication of a III-Nitride or other group III-V device. Examples of devices for which substrate 210 may be utilized include group III-V Schottky diodes, and group III-V heterostructure field-effect transistors (HFETs), such as III-Nitride or other group III-V high electron mobility transistors (HEMTs).

Substrate 210 may be formed of a group IV material such as silicon (Si), or may be a silicon carbide (SiC) or sapphire substrate. Moreover, although substrate 210 is shown as a substantially unitary substrate in FIG. 2A, in other implementations, substrate 210 may be a composite substrate, such as a silicon on insulator (SOI) substrate, a silicon on sapphire (SOS) substrate, or a single-crystal or polycrystalline SiC on silicon substrate, for example.

According to the implementation shown by structure 202, nucleation layer 212 is situated over substrate 210. Nucleation layer 212 may be formed of aluminum nitride (AlN), and may have a thickness in a range from approximately one hundred nanometers to approximately four hundred nanometers (100-400 nm), such as 250 nm, for example. Nucleation layer 212 may be formed directly on or over substrate 210 using any of metalorganic chemical vapor deposition (MOCVD), molecular-beam epitaxy (MBE), hydride vapor phase epitaxy (HVPE), plasma enhanced vapor phase epitaxy (PECVD), or atomic layer epitaxy (ALE), to name a few suitable techniques.

Moving to FIG. 2B with continued reference to FIG. 1, flowchart 100 continues with forming III-Nitride intermediate stack 220 including transition body 222 and protrusion propagation body 230 over nucleation layer 212 (action 104).

As shown by structure 204, in implementations in which substrate 210 is a non-native substrate for fabrication of a III-Nitride device, such as a III-Nitride HEMT, III-Nitride intermediate stack 220 may include transition body 222 situated between substrate 210 and a subsequently fabricated III-Nitride device. As a specific example, where substrate 210 is a silicon substrate, transition body 222 may include multiple distinguishable III-Nitride material layers helping to mediate the lattice transition from substrate 210 to the active layers of the overlying III-Nitride device (active layers not shown in FIG. 2B).

In implementations in which the III-Nitride device is a gallium nitride (GaN) based device, for example, transition body 222 may include a series of aluminum gallium nitride (AlGaN) layers having a progressively reduced aluminum content relative to their gallium content, from the interface of transition body 222 with nucleation layer 212 to the top of transition body 222. Moreover, in some implementations, transition body 222 may be a compositionally graded body having different AlGaN, or other III-Nitride or group III-V alloy compositions at its respective top and bottom surfaces. Transition body 222 may be formed over nucleation layer 212 using any of MOCVD, MBE, HVPE, PECVD, or ALE to a thickness in a range from approximately 150-1000 nm, such as 500 nm, for example.

As further shown by structure 204, according to the present exemplary implementation, protrusion propagation body 230 is situated over transition body 222. Like transition body 222, protrusion propagation body 230 may be formed using any of MOCVD, MBE, HVPE, PECVD, or ALE, for example.

Referring to FIG. 2C, FIG. 2C shows a more detailed cross-sectional view of protrusion propagation body 230, according to one exemplary implementation. As shown in FIG. 2C, protrusion propagation body 230 includes protrusion inducing layer 232, protrusion generating layer 234 situated directly on protrusion inducing layer 232, and protrusion spreading multilayers 240a, 240b, . . . 240n (hereinafter "protrusion spreading multilayers 240a-240n") stacked over protrusion generating layer 234.

In addition, FIG. 2C shows protrusions 238 generated at or near the interface of protrusion inducing layer 232 and protrusion generating layer 234. Also shown in FIG. 2C are the respective thicknesses of protrusion inducing layer 232, protrusion generating layer 234 and the layers included in each of exemplary protrusion spreading multilayers 240a-240n.

In the interests of conceptual clarity, protrusion propagation body 230 will be described as it might be implemented as part of a semiconductor component providing a GaN based HEMT. Thus, the various layers included in protrusion propagation body 230 will be described by reference to specific III-Nitride alloy compositions, specific thicknesses, and in some instances, specific growth conditions suitable for such an implementation. It is noted, however, that the details provided are not to be interpreted as limitations, and, in other implementations, the various layers included in protrusion propagation body 230 may have other III-Nitride alloy compositions, different thicknesses, and/or may be formed using different growth conditions.

According to the exemplary implementation shown in FIG. 2C, protrusion inducing layer 232 may be an AlGaN layer having an alloy composition in a range $Al_XGaN_{(1-X)}$ ($0.5 \leq X \leq 1$). Protrusion inducing layer 232 may be formed using any of MOCVD, MBE, HVPE, PECVD, or ALE, and may have thickness 258 of up to approximately 150 nm, such as 75 nm, for example. Moreover, it may be advantageous or desirable to form protrusion inducing layer 232 at a growth temperature lower than a growth temperature used to form nucleation layer 212. For instance, protrusion inducing layer 232 may be formed using a growth temperature that is approximately thirty to one hundred degrees Celsius (30-100° C.) lower than the growth temperature used to form nucleation layer 212.

Protrusion generating layer 234 having thickness 236 may be formed directly on protrusion inducing layer 232 using any of MOCVD, MBE, HVPE, PECVD, or ALE, for example. As a specific example, where protrusion inducing layer 232 is an AlGaN layer as described above, protrusion generating layer 234 may be a GaN layer having thickness 236 in a range from approximately 2 nm to approximately 12 nm, such as 6 nm.

Protrusion generating layer 234 may be formed using a growth temperature that is higher than the growth temperature used to form protrusion inducing layer 232, but lower than the growth temperature used to form nucleation layer 212. As a specific example, protrusion generating layer 234 may be formed using a growth temperature in a range from approximately 1015-1060° C., at a pressure in a range from approximately seventy-five millibar to approximately one hundred and fifty millibar (75-150 mbar). As shown in FIG. 2C, protrusions 238 are formed at or near the interface of protrusion inducing layer 232 and protrusion generating layer 234. Protrusions 238 may have an initial diameter of less than approximately 100 nm, such as a diameter of tens of nanometers, for example.

In implementations in which protrusion generating layer 234 is a GaN layer, protrusions 238 occur at a critical thickness of the GaN layer that is highly dependent on the GaN growth temperature (which determines interaction strength between Ga adatoms and the surface), as well as the lattice mismatch induced strain energy being received from adsorbent $Al_XGaN_{(1-X)}$ ($0.5 \leq X \leq 1$) protrusion-inducing layer 232. Decreasing the GaN growth temperature and increasing the thickness of protrusion inducing layer 232 causes that critical thickness to decrease while increasing the areal density of protrusions 238 generated by GaN protrusion generating layer 234.

It is noted that although protrusions 238 are depicted in FIG. 2C as having an approximately uniform size and shape, more generally, protrusions 238 can vary in size and may initially display a variety of crystalline facets. It is further noted that protrusions 238 may be initially formed by protrusion generating layer 234 so as to extend partially into layer 242a of protrusion spreading multilayer 240a.

Protrusion spreading multilayers 240a-240n are stacked over protrusion generating layer 234, and cause protrusions 238 to spread between protrusion spreading multilayer 240a and protrusion spreading multilayer 240n. That is to say, with growth of protrusion spreading multilayers 240a-240n, the lateral growth rate of protrusions 238 becomes faster than their growth in the direction normal to substrate 210. After growth of ten to twenty of protrusion spreading multilayers 240a-240n, such as fifteen protrusion spreading multilayers (i.e., n=15), protrusions 238 may spread so as to have a diameter in a range from approximately two to approximately three micrometers (2-3 μm), while their height may be no greater than 100-200 nm above a surrounding protrusion free flat surface. Through this constrained enhancement of protrusion dimensions, an effective filtering of threading dislocations propagating upward through protrusion propagation body 230 is achieved.

According to the exemplary implementation shown in FIG. 2C, protrusion spreading multilayer 240a includes layer 242a having thickness 252, layer 244a having thickness 254 and situated over layer 242a, and layer 246a having thickness 256 and situated over layer 244a. Similarly, protrusion spreading multilayer 240b includes layer 242b having thickness 252, layer 244b having thickness 254 and situated over layer 242b, and layer 246b having thickness 256 and situated over layer 244b. In addition, all other protrusion spreading multilayers included in protrusion propagation body 230 may be similarly constituted. Thus, for example, protrusion spreading multilayer 240n includes layer 242n having thickness 252, layer 244n having thickness 254 and situated over layer 242n, and layer 246n having thickness 256 and situated over layer 244n. It is noted that in some implementations, it may be advantageous or desirable for protrusion spreading multilayers 240a-240n to number ten or more. In other words, in those implementations, "n" is equal to at least ten.

Protrusion spreading multilayers 240a-240n may be formed using any of MOCVD, MBE, HVPE, PECVD, or ALE, for example. As a specific example, layer 242a and layers 242b through 242n may be AlN layers having thickness 252 in a range from approximately 1-8 nm, such as 2.5 nm. Layer 244a, and layers 244b through 244n may be AlGaN layers provided for bi-axial strain relief, and may have an alloy composition in a range $Al_YGaN_{(1-Y)}$ ($0<Y<1$), and a thickness 254 in a range from approximately 1-8 nm, such as 2.5 nm. Moreover, layer 246a, and layers 246b through 246n may be GaN layers having thickness 256 in a range from approximately 2-10 nm, such as 5 nm.

With respect to layers 244a through 244n, as noted above, those AlGaN layers are provided for bi-axial strain relief. In some implementations, it may be advantageous or desirable to include AlGaN strain relief layers 244a through 244n between respective AlN layers 242a through 242n and respective GaN layers 246a through 246n in order to maintain the areal density of protrusions 238 in a desirable range. When the areal density of protrusions 238 exceeds desirable values, the crystalline quality of subsequently grown device layers may be reduced due to generation of dislocation loops.

It is noted that although the exemplary implementation shown in FIG. 2C depicts each of protrusion spreading multilayers 240a-240n as tri-layers, in other implementations, protrusion spreading multilayers 240a-240n may include fewer, or more, than three layers. It is further noted that although the layers included in protrusion spreading multilayers 240a-240n are described above in terms of a substantially constant III-Nitride material or alloy composition, that representation is also merely exemplary. In other implementations, for example, any or all of layers 242a, 244a, 246a, 242b, 244b, 246b, . . . 242n, 244n, and 246n may be compositionally graded layers.

Referring now to FIG. 2D while continuing to refer to FIG. 1, flowchart 100 continues with forming III-Nitride buffer layer 214 and III-Nitride back barrier 216 over III-Nitride intermediate stack 220 (action 106). As shown by structure 206, III-Nitride buffer layer 214 may be formed so as to be situated directly on or over III-Nitride intermediate stack 220. In implementations in which the subsequently fabricated overlying group III-V device is a GaN based device, for example, III-Nitride buffer layer 214 and III-Nitride back barrier 216 may be implemented as AlGaN layers. Like the various layers of III-Nitride intermediate stack 220, III-Nitride buffer layer 214 and III-Nitride back barrier 216 may be formed using any of MOCVD, MBE, HVPE, PECVD, or ALE, for example.

It is noted that although III-Nitride buffer layer 214 and III-Nitride back barrier 216 situated over III-Nitride buffer layer 214 may both be formed as AlGaN layers, III-Nitride buffer layer 214 and III-Nitride back barrier 216 are typically formed using different growth conditions so as to imbue each with distinct characteristics. For example, III-Nitride buffer layer 214 may be formed at a low growth temperature, resulting in III-Nitride buffer layer 214 being an impurity rich III-Nitride layer, such as an impurity rich AlGaN layer, providing good electrical insulation between III-Nitride intermediate stack 220 and the active layers of the overlying III-Nitride device (active layers not shown in FIG. 2D). By contrast, III-Nitride back barrier 216 may be an AlGaN layer formed over III-Nitride buffer layer 214 so as to have a reduced impurity concentration relative to III-Nitride buffer layer 214. In other words, III-Nitride buffer layer 214 may be grown at a lower temperature than overlying III-Nitride back barrier 216 so as to have a higher impurity concentration than III-Nitride back barrier 216.

It is further noted that in some implementations, III-Nitride buffer layer 214 may be formed as an impurity graded buffer layer having a higher impurity concentration at its bottom surface, i.e., the surface of III-Nitride buffer layer 214 interfacing III-Nitride intermediate stack 220, and a lower impurity concentration at its opposite top surface. In some of those implementations, III-Nitride back barrier 216 may be omitted.

Continuing to FIG. 2E with further reference to FIG. 1, flowchart 100 can conclude with fabricating III-Nitride device 218 over III-Nitride buffer layer 214 and III-Nitride back barrier 216 (action 108). As a result, FIG. 2E shows a cross-sectional view of exemplary semiconductor component 208, which includes III-Nitride intermediate stack 220 with protrusion propagation body 230.

It is noted that although III-Nitride device 218 is depicted as a HEMT in FIG. 2E, that representation is merely exemplary. In other implementations, semiconductor component 208 including protrusion propagation body 230 may be suitably adapted to provide another type of group III-V device corresponding to III-Nitride device 218. For example, in other implementations, III-Nitride device 218 may take the form of another type of group III-V power switching device, such as any type of HFET, or a Schottky diode.

Nevertheless, for merely exemplary purposes, III-Nitride device 218 will be described as a III-Nitride HEMT (hereinafter "HEMT 218") including active layers in the form of GaN channel layer 224 and overlying AlGaN barrier layer 228, drain electrode 262, source electrode 264, and gate 266. As shown in FIG. 2E, in its on-state, HEMT 218 includes two-dimensional electron gas (2 DEG) 226 providing a low resistance conduction channel between drain electrode 262 and source electrode 264. As further shown in FIG. 2E, 2 DEG 226 is generated at or near the interface of the active layers of HEMT 218, i.e., GaN channel layer 224 and AlGaN barrier layer 228 having a larger bandgap than that of GaN channel layer 224.

Active GaN channel layer 224 and AlGaN barrier layer 228 of HEMT 218 may be formed over III-Nitride buffer layer 214 and III-Nitride back barrier 216 using any of a number of known growth techniques. For instance, GaN channel layer 224 and AlGaN barrier layer 228 may be formed using MOCVD, MBE, HVPE, PECVD, or ALE to name a few suitable techniques.

According to the exemplary implementation shown in FIG. 2E, the dimensionally enhanced protrusions produced by protrusion propagation body 230 result in a selective area growth at an early growth stage of impurity rich AlGaN buffer layer 214, causing the surface to gradually become flat with further growth through lateral coalescence. In such a lateral coalescence process, dislocation deflection in AlGaN buffer layer 214 can advantageously result in an approximately 30% to an approximately 50% reduction in the dislocation density within GaN channel layer 224. Thus, protrusion propagation body 230 substantially improves overall III-Nitride crystal quality in semiconductor component 208 when compared to semiconductor components from which protrusion propagation body 230 is omitted.

Referring now to FIG. 3A, FIG. 3A shows a cross-sectional view of exemplary semiconductor component 308 including III-Nitride intermediate stack 320 having protrusion propagation body 370, according to another implementation. It is noted that the features in FIG. 3A identified by reference numbers corresponding to those shown in FIGS. 2A-2E, correspond respectively to those previously described features.

Thus, substrate 310, nucleation layer 312, and transition body 322 correspond respectively in general to substrate 210 and nucleation layer 212 in FIGS. 2A, 2B, 2D, and 2E, and to transition body 222 in FIGS. 2B, 2D, and 2E, and may share any of the characteristics attributed to those corresponding features in the present application. In addition, III-Nitride buffer layer 314 and III-Nitride back barrier 316 correspond respectively in general to III-Nitride buffer layer 214 and III-Nitride back barrier 216 in FIGS. 2D and 2E, and may share any of the characteristics attributed to those corresponding features in the present application.

III-Nitride device 318, in FIG. 3A, corresponds to HEMT 218, in FIG. 2E and may share any of the characteristics attributed to that corresponding feature in the present application. Thus, channel layer 324, barrier layer 328, 2 DEG 326, drain electrode 362, source electrode 364, and gate 366, in FIG. 3A, correspond respectively in general to GaN channel layer 224, AlGaN barrier layer 228, 2 DEG 226, drain electrode 262, source electrode 264, and gate 266, in FIG. 2E.

It is noted that although III-Nitride device 318 is shown and described as corresponding to HEMT 218. In other implementations, semiconductor component 308 may be suitably adapted to provide another type of group III-V device corresponding to III-Nitride device 318. For example, in other implementations, III-Nitride device 318 may take the form of another type of group III-V power switching device, such as any type of HFET, or a Schottky diode.

In contrast to semiconductor component 208, in FIG. 2E, in which protrusion propagation body 230 is situated over transition body 222 in III-Nitride intermediate stack 220, according to the alternative implementation shown in FIG. 3A, those respective positions are reversed. That is to say, III-Nitride intermediate stack 320 of semiconductor component 308 includes transition body 322 situated over protrusion propagation body 370, which is itself situated directly on nucleation layer 312.

Referring to FIG. 3B, FIG. 3B shows a more detailed cross-sectional view of protrusion propagation body 370, according to the alternative exemplary implementation shown in FIG. 3A. As shown in FIG. 3B, protrusion propagation body 370 includes protrusion generating layer 372, and protrusion spreading multilayers 380a, 380b, . . . , 380n (hereinafter "protrusion spreading multilayers 380a-380n") stacked over protrusion generating layer 372.

In addition, FIG. 3B shows protrusions 378 generated at or near a bottom surface of protrusion generating layer 372, i.e., the surface of protrusion generating layer 372 opposite protrusion spreading multilayer 380a. Also shown in FIG. 3B are the respective thicknesses of protrusion generating layer 372 and the layers included in each of exemplary protrusion spreading multilayers 380a-380n.

In the interests of conceptual clarity, protrusion propagation body 370 will be described as it might be implemented as part of a semiconductor component providing a GaN based HEMT. Thus, the various layers included in protrusion propagation body 370 will be described by reference to specific III-Nitride alloy compositions, specific thicknesses, and in some instances, specific growth conditions suitable for such an implementation. It is noted, however, that the details provided are not to be interpreted as limitations, and, in other implementations, the various layers included in protrusion propagation body 370 may have other III-Nitride alloy compositions, different thicknesses, and/or may be formed using different growth conditions.

Protrusion generating layer 372 having thickness 374 may be formed directly on nucleation layer 312 using any of MOCVD, MBE, HVPE, PECVD, or ALE, for example. It is noted that in the present exemplary implementation, nucleation layer 312 plays a role analogous to protrusion inducing layer 232, in FIG. 2C. However, as noted above by reference to corresponding nucleation layer 212, nucleation layer 312 may be an AlN layer having a thickness in a range from approximately 100-400 nm, such as 250 nm, for example. In implementations in which nucleation layer 312 having the features described above is used as a protrusion inducing layer of semiconductor component 308, protrusion generating layer 372 may be a GaN layer having thickness 374 in a range from approximately 1 nm to approximately 10 nm, such as 4 nm.

Protrusion generating layer 372 may be formed using a growth temperature in a range from approximately 1015-1060° C., at a pressure in a range from approximately seventy-five millibar to approximately 75-150 mbar, for example. As shown in FIG. 3B, protrusions 378 are formed at or near the bottom surface of protrusion generating layer 372. Protrusions 378 may have an initial diameter of less than approximately 100 nm, such as a diameter of tens of nanometers, for example.

In implementations in which protrusion generating layer 372 is a GaN layer, protrusions 378 occur at a critical thickness of the GaN layer that is highly dependent on the GaN growth temperature (which determines interaction strength between Ga adatoms and the surface), as well as the lattice mismatch induced strain energy being received from nucleation layer 312. Decreasing the GaN growth temperature and increasing the thickness of nucleation layer 312 causes that critical thickness to decrease while increasing the areal density of protrusions 378 generated by GaN protrusion generating layer 372.

It is noted that although protrusions 378 are depicted in FIG. 3B as having an approximately uniform size and shape, more generally, protrusions 378 can vary in size and may initially display a variety of crystalline facets. It is further noted that protrusions 378 may be initially formed by protrusion generating layer 372 so as to extend partially into layer 382a of protrusion spreading multilayer 380a.

Protrusion spreading multilayers 380a-380n are stacked over protrusion generating layer 372, and cause protrusions 378 to spread between protrusion spreading multilayer 380a and protrusion spreading multilayer 380n. That is to say, with growth of protrusion spreading multilayers 380a-380n, the lateral growth rate of protrusions 378 becomes faster than their growth in the direction normal to substrate 310. After growth of ten to twenty of protrusion spreading multilayers 380a-380n, such as fifteen protrusion spreading multilayers (i.e., n=15), protrusions 378 may spread so as to have a diameter in a range from approximately 2-3 μm, while their height may be no greater than 100-200 nm above a surrounding protrusion free flat surface. Through this constrained enhancement of protrusion dimensions, an effective filtering of threading dislocations propagating upward through protrusion propagation body 370 is achieved.

According to the exemplary implementation shown in FIG. 3B, protrusion spreading multilayer 380a includes layer 382a having thickness 392, layer 384a having thickness 394 and situated over layer 382a, and layer 386a having thickness 396 and situated over layer 384a. Similarly, protrusion spreading multilayer 380b includes layer 382b having thickness 392, layer 384b having thickness 394 and situated over layer 382b, and layer 386b having thickness 396 and situated over layer 384b. In addition, all other protrusion spreading multilayers included in protrusion propagation body 370 may be similarly constituted. Thus, for example, protrusion spreading multilayer 380n includes layer 382n having thickness 392, layer 384n having thickness 394 and situated over layer 382n, and layer 386n having thickness 396 and situated over layer 384n. It is noted that in some implementations, it may be advantageous or desirable for protrusion spreading multilayers 380a-380n to number ten or more. In other words, in those implementations, "n" is equal to at least ten.

Protrusion spreading multilayers 380a-380n may be formed using any of MOCVD, MBE, HYPE, PECVD, or ALE, for example. As a specific example, layer 382a and layers 382b through 382n may be AlN layers having thickness 392 in a range from approximately 0.5-6 nm. Layer 384a, and layers 384b through 384n may be AlGaN layers provided for bi-axial strain relief, and may have an alloy composition in a range $Al_YGaN_{(1-Y)}$ (0<Y<1), and a thickness 394 in a range from approximately 0.5-6 nm. Moreover, layer 386a, and layers 386b through 386n may be GaN layers having thickness 396 in a range from approximately 1-8 nm.

With respect to layers 384a through 384n, as noted above, those AlGaN layers are provided for bi-axial strain relief. In some implementations, it may be advantageous or desirable to include AlGaN strain relief layers 384a through 384n between respective AlN layers 382a through 382n and respective GaN layers 386a through 386n in order to maintain the areal density of protrusions 378 in a desirable range. When the areal density of protrusions 378 exceeds desirable values, the crystalline quality of subsequently grown device layers may be reduced due to generation of dislocation loops.

It is noted that although the exemplary implementation shown in FIG. 3B depicts each of protrusion spreading multilayers 380a-380n as tri-layers, in other implementations, protrusion spreading multilayers 380a-380n may include fewer, or more, than three layers. It is further noted that although the layers included in protrusion spreading multilayers 380a-380n are described above in terms of a substantially constant III-Nitride material or alloy composition, that representation is also merely exemplary. In other implementations, for example, any or all of layers 382a, 384a, 386a, 382b, 384b, 386b, . . . 382n, 384n, and 386n may be compositionally graded layers.

Thus, the present application discloses a semiconductor component having a III-Nitride intermediate stack including a protrusion propagation body that advantageously enables the growth of III-Nitride device layers or films having substantially improved crystal quality. That is to say, the subsequently grown overlying III-Nitride device layers or films have reduced crystal dislocations compared to III-Nitride device layers or films in conventional semiconductor components from which the presently disclosed protrusion propagation body is omitted. As a result, the inventive concepts disclosed in the present application advantageously enable fabrication of III-Nitride and other group III-V based transistors, for example, having improved high frequency performance and reduced leakage current under high drain bias voltages.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor component comprising:
a substrate;
a nucleation layer situated over said substrate;
a III-Nitride intermediate stack situated over said nucleation layer;
a III-Nitride buffer layer situated over said III-Nitride intermediate stack;
a III-Nitride device fabricated over said III-Nitride buffer layer;
wherein said III-Nitride intermediate stack comprises a protrusion propagation body situated over a transition body, said protrusion propagation body including a protrusion inducing layer, a protrusion generating layer, a plurality of protrusion spreading multilayers, and a plurality of protrusions originating from said protrusion generating layer and propagating into said protrusion spreading multilayers, wherein said protrusions propagate laterally in a direction normal to said substrate from a lower layer of said protrusion spreading multilayers to a layer of said protrusion spreading multilayers above the lower layer so that said protrusions are wider and shallower at said upper layer as compared to at said lower layer.

2. The semiconductor component of claim 1, wherein said protrusion inducing layer comprises aluminum nitride (AlN).

3. The semiconductor component of claim 1, wherein said protrusion generating layer is a gallium nitride (GaN) layer.

4. The semiconductor component of claim 1, wherein at least one of said plurality of protrusion spreading multilayers comprises an AlN layer, an aluminum gallium nitride (AlGaN), and a GaN layer.

5. The semiconductor component of claim 1, wherein said plurality of protrusion spreading multilayers comprises at least ten protrusion spreading multilayers.

6. The semiconductor component of claim 1, wherein said III-Nitride buffer layer comprises AlGaN.

7. The semiconductor component of claim 1, further comprising a III-Nitride back barrier situated between said III-Nitride buffer layer and said III-Nitride device.

8. The semiconductor component of claim 7, wherein said III-Nitride back barrier comprises AlGaN.

9. The semiconductor component of claim 7, wherein said III-Nitride buffer layer is grown at a lower temperature than said III-Nitride back barrier so as to have a higher impurity concentration than said III-Nitride back barrier.

10. The semiconductor component of claim 1, wherein said III-Nitride device comprises a III-Nitride high electron mobility transistor (HEMT).

11. The semiconductor component of claim 1, wherein said plurality of protrusion spreading multilayers comprises at least ten layers, wherein said protrusions have a diameter of less than approximately 100 nm at said lower layer of said protrusion spreading multilayers and a diameter of approximately 2-3 µm at a tenth layer of said protrusion spreading multilayers above said lower layer.

12. The semiconductor component of claim 11, wherein said protrusions have a height above a surrounding protrusion free flat surface at said tenth layer that is less than 200 nm.

13. The semiconductor component of claim 11, wherein at said tenth layer, a diameter of said protrusions is approximately 25 times a height of said protrusions.

* * * * *